(12) United States Patent
Korec et al.

(10) Patent No.: US 7,560,808 B2
(45) Date of Patent: Jul. 14, 2009

(54) CHIP SCALE POWER LDMOS DEVICE

(75) Inventors: Jacek Korec, Sunrise, FL (US);
Shuming Xu, Schnecksville, PA (US);
Wenhua Dai, Allentown, PA (US)

(73) Assignee: Texas Instruments Incorporated,
Dallas, TX (US)

( * ) Notice: Subject to any disclaimer, the term of this patent is extended or adjusted under 35 U.S.C. 154(b) by 462 days.

(21) Appl. No.: 11/254,482

(22) Filed: Oct. 19, 2005

(65) Prior Publication Data

US 2007/0085204 A1  Apr. 19, 2007

(51) Int. Cl.
*H01L 29/76* (2006.01)

(52) U.S. Cl. .................. 257/691; 257/738; 257/723; 257/737; 257/E23.079

(58) Field of Classification Search ................. 257/737, 257/738, 691, 723, E23.079
See application file for complete search history.

(56) References Cited

U.S. PATENT DOCUMENTS

| | | | |
|---|---|---|---|
| 4,455,565 A | | 6/1984 | Goodman et al. |
| 4,984,061 A | * | 1/1991 | Matsumoto ................. 257/776 |
| 5,155,563 A | | 10/1992 | Davies et al. |
| 5,252,848 A | | 10/1993 | Adler et al. |
| 5,625,226 A | | 4/1997 | Kinzer |
| 5,841,166 A | | 11/1998 | D'Anna et al. |
| 5,907,173 A | | 5/1999 | Kwon et al. |
| 5,912,490 A | | 6/1999 | Hebert et al. |
| 5,945,709 A | * | 8/1999 | Williams et al. ............. 257/343 |
| 5,949,104 A | | 9/1999 | D'Anna et al. |
| 5,959,357 A | * | 9/1999 | Korman ...................... 257/758 |
| 5,977,630 A | | 11/1999 | Woodworth et al. |
| 6,001,710 A | | 12/1999 | Francois et al. |
| 6,040,626 A | | 3/2000 | Cheah et al. |
| 6,075,286 A | | 6/2000 | Ewer |
| 6,215,152 B1 | | 4/2001 | Hebert |
| 6,242,800 B1 | | 6/2001 | Munos et al. |

(Continued)

OTHER PUBLICATIONS

Bai, et al., "Comparative Thermal and Thermomechanical Analyses of Solder-Bump and Direct-Solder Bonded Power Device Packages Having Double-Sided Cooling Capability," IEEE, 2004.

(Continued)

*Primary Examiner*—Eugene Lee
(74) *Attorney, Agent, or Firm*—William B. Kempler; Wade J. Brady, III; Frederick J. Telecky, Jr.

(57) ABSTRACT

A semiconductor device includes at least one macro-cell device, the macro-cell device comprising a plurality of LDMOS devices. A first conductive layer is formed over the substrate, the first conductive layer providing source and drain contacts for the macro-cell device. A first isolation layer is formed over the first conductive layer and a second conductive layer is formed over the first isolation layer, the second conductive layer forming a drain bus and a source bus, wherein the buses are electrically coupled to the contacts through the first isolation layer. A second isolation layer is formed over the second conductive layer and insulates the source bus from the drain bus. A plurality of conductive bumps are formed over the second isolation layer, at least one of the conductive bumps directly contacting the drain bus and at least one of the conductive bumps directly contacting the source bus through the second isolation layer.

19 Claims, 10 Drawing Sheets

U.S. PATENT DOCUMENTS

| | | |
|---|---|---|
| 6,372,557 B1 | 4/2002 | Leong |
| 6,396,127 B1 | 5/2002 | Munoz et al. |
| 6,404,050 B2 | 6/2002 | Davis et al. |
| 6,482,680 B1 | 11/2002 | Khor et al. |
| 6,489,678 B1 | 12/2002 | Joshi |
| 6,521,923 B1 | 2/2003 | D'Anna et al. |
| D471,165 S | 3/2003 | Williams et al. |
| D472,528 S | 4/2003 | Kasem et al. |
| 6,586,824 B1 | 7/2003 | Glenn et al. |
| 6,593,622 B2 | 7/2003 | Kinzer et al. |
| 6,611,047 B2 | 8/2003 | Hu et al. |
| 6,617,655 B1 | 9/2003 | Estacio et al. |
| 6,617,696 B1 * | 9/2003 | Bendal .................. 257/780 |
| 6,627,976 B1 | 9/2003 | Chung et al. |
| 6,630,726 B1 | 10/2003 | Crowley et al. |
| 6,639,308 B1 | 10/2003 | Crowley et al. |
| 6,645,791 B2 | 11/2003 | Noquil et al. |
| 6,646,329 B2 | 11/2003 | Estacio et al. |
| 6,653,740 B2 | 11/2003 | Kinzer et al. |
| 6,661,082 B1 | 12/2003 | Granada et al. |
| 6,677,663 B1 | 1/2004 | Ku et al. |
| 6,677,669 B2 | 1/2004 | Standing |
| 6,696,321 B2 | 2/2004 | Joshi |
| 6,696,747 B1 | 2/2004 | Lee et al. |
| 6,700,187 B2 | 3/2004 | Paek |
| 6,707,138 B2 | 3/2004 | Crowley et al. |
| 6,713,322 B2 | 3/2004 | Lee |
| 6,720,618 B2 | 4/2004 | Kawaguchi et al. |
| 6,723,582 B2 | 4/2004 | Glenn et al. |
| 6,744,124 B1 | 6/2004 | Chang et al. |
| 6,753,605 B2 | 6/2004 | Joshi |
| 6,756,658 B1 | 6/2004 | Gillett et al. |
| 6,762,067 B1 | 7/2004 | Quinones et al. |
| 6,818,973 B1 | 11/2004 | Foster |
| 6,831,332 B2 | 12/2004 | D'Anna et al. |
| 6,838,309 B1 | 1/2005 | McCann |
| 6,844,615 B1 | 1/2005 | Edwards et al. |
| 6,846,704 B2 | 1/2005 | Paek |
| 6,847,103 B1 | 1/2005 | Perez et al. |
| 6,853,060 B1 | 2/2005 | Seok et al. |
| 6,858,919 B2 | 2/2005 | Seo et al. |
| 6,873,041 B1 | 3/2005 | Crowley et al. |
| 6,949,822 B2 * | 9/2005 | Shivkumar et al. .......... 257/704 |
| 2001/0030362 A1 | 10/2001 | Grant |
| 2001/0045627 A1 | 11/2001 | Connah et al. |
| 2001/0048116 A1 | 12/2001 | Standing et al. |
| 2001/0048154 A1 | 12/2001 | Cheah et al. |
| 2001/0052639 A1 | 12/2001 | Jeon et al. |
| 2002/0008319 A1 | 1/2002 | Davis et al. |
| 2002/0066950 A1 | 6/2002 | Joshi |
| 2002/0070441 A1 | 6/2002 | Cheah |
| 2002/0135079 A1 | 9/2002 | Shivkumar et al. |
| 2002/0163040 A1 | 11/2002 | Kinzer et al. |
| 2002/0190285 A1 * | 12/2002 | Sakamoto et al. .......... 257/288 |
| 2003/0011005 A1 | 1/2003 | Joshi |
| 2003/0016505 A1 | 1/2003 | Jauregui |
| 2003/0067071 A1 | 4/2003 | Cardwell |
| 2003/0075786 A1 | 4/2003 | Joshi et al. |
| 2003/0107126 A1 | 6/2003 | Joshi et al. |
| 2003/0122247 A1 | 7/2003 | Joshi et al. |
| 2003/0214034 A1 * | 11/2003 | Abe et al. .................. 257/737 |
| 2004/0021233 A1 | 2/2004 | Kinzer et al. |
| 2004/0061221 A1 | 4/2004 | Schaffer |
| 2004/0159939 A1 | 8/2004 | Joshi et al. |
| 2004/0164386 A1 | 8/2004 | Joshi et al. |
| 2004/0201086 A1 | 10/2004 | Joshi et al. |
| 2005/0017298 A1 | 1/2005 | Xie et al. |
| 2005/0017299 A1 | 1/2005 | Shen |

OTHER PUBLICATIONS

Cheon Soo Kim et al., Trenched Sinker LDMOSFET (TS-LDMOS) Structure for High Power Amplifier Application above 2 GHz, IEEE No. 0-7803-7050-3/01, 2001, pp. IEDM 01-887-IEDM 01-890.

Yasuhova, Matsushita et al., "Low Gate Charge 30 V N-channel LDMOS for DC-DC converters," International Symposium On Power Semiconductor Devices & ICS (15TH: 2003: Cambridge, England) (4 pages).

Xu, Baiocchi et al., "High Power Silicon RF LDMOSFET Technology for 2.1 GHZ Power Amplifier Applications," IEE Proceedings—Circuits Devices Syst. vol. 151, No. 3, Jun. 2004 pp (4 pages).

Xu, Shibib et al., "High Performance RF Power LDMOSFET Technology for 2.1 GHZ Power Amplifier Applications," Microwave Symposium Digest, 2003 IEEE MTT-S International Publication Date: Jun. 8-13, 2003 vol. 1, pp. 217-220.

* cited by examiner

100

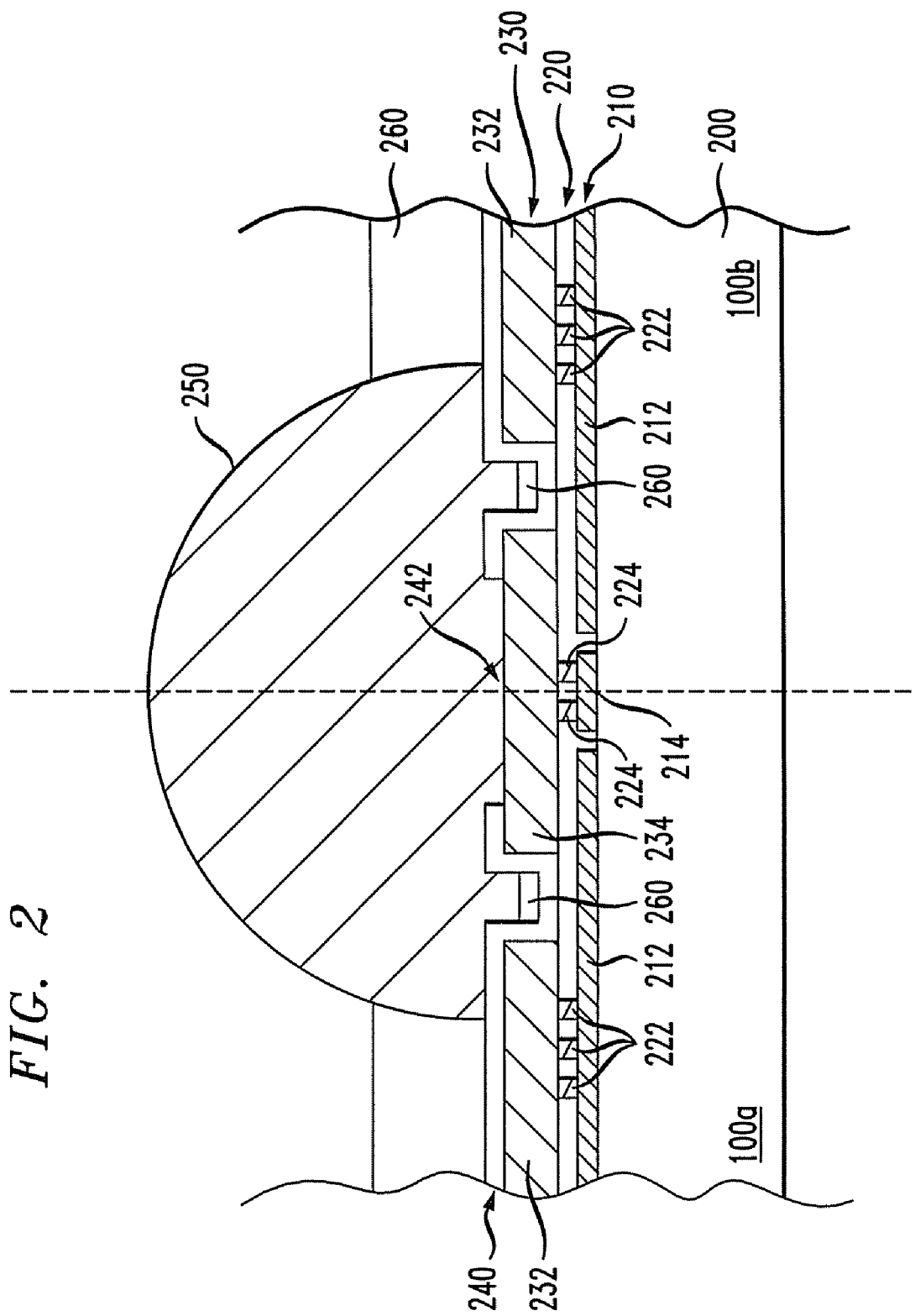

300

500

CHIP SCALE POWER LDMOS DEVICE

FIELD OF THE INVENTION

The present invention relates to semiconductor devices and more particularly to methods of interconnecting semiconductor devices.

BACKGROUND OF THE INVENTION

Semiconductor devices, such as power MOS (metal oxide semiconductor) devices used as electric switches for high frequency PWM (pulse width modulation) applications such as voltage regulators and/or as load switches in power applications typically include a semiconductor die, with thousands of elemental transistors formed therein, and a package for housing and protecting the die and for providing connections to terminals formed on the die. In many applications, it is highly desirable to keep the footprint of the packaged device as small as possible, such as in mobile and other small electronic applications. For a typical packaged power MOS device, the ratio of the die size to the overall package size is typically about 25-50%, meaning that with some packages, the packaged product has a footprint that is about 4 times larger than the packaged die.

In addition to the increased size of the finished product attributable to the packaging, packaging also adds parasitic inductances, capacitances and resistances that can adversely affect device performance, such as the on-resistance ($R_{ds,on}$) of the device. Packaging also adds an additional thermal barrier between the die and its environment, which affects heat dissipation.

Given the problems associated with packaging semiconductor devices, there is a desire for so-called chip-scale devices. These devices have no packaging formed around the die, although passivation layer(s) may be utilized. Rather, metallization layers are formed directly on the die and solder bumps are coupled to the metallization layers, such as through connection pads. These solder bumps are formed on only one side of the finished device for coupling to, for example, printed circuit boards.

Power MOS devices have not been considered good candidates for the chip-scale approach, as power MOS devices typically utilize vertical current flow, which dictates that connections are made to both sides of the semiconductor die. Notwithstanding the foregoing, at least one chip-scale power MOSFET (MOS field effect transistor) has been proposed in U.S. Published Patent Application No. 2005/0017299A1 to Shen, the entirety of which is hereby incorporated by reference herein. Shen proposes a power MOS device with purely lateral current flow, so that all connection terminals can be formed on the top side of the die. In so doing, Shen employs a complex multilevel bus structure for collecting and distributing the device current. The design necessarily employs a very dense bus structure, i.e., it requires a high number of bus stripes, so bus stripes are made very narrow and thin, providing a consequent resistive voltage drop. This voltage drop, in turn, leads to the de-biasing effect where gate-source driving potential is weakened locally at some transistor cells. Still further, the purely lateral current flow device structure affords equal silicon area to both the source and drain of each transistor formed in the die, which is very area consumptive.

Therefore, there remains a need for an improved chip-scale (or near chip-scale) semiconductor device, and particularly an improved chip-scale (or near chip-scale) power MOS device.

SUMMARY OF THE INVENTION

A semiconductor device includes at least one macro-cell device, the macro-cell device comprising a plurality of LDMOS devices formed over a semiconductor substrate and coupled together to form the macro-cell device, wherein current flows across the macro-cell device through the substrate to a common vertical contact. A first conductive layer is formed over the substrate, the first conductive layer providing source and drain contacts for the macro-cell device, the drain contact electrically coupled to the common vertical contact. A first isolation layer is formed over the first conductive layer and a second conductive layer is formed over the first isolation layer, the second conductive layer forming a drain bus and a source bus, wherein the drain bus is electrically coupled to the drain contact through the first isolation layer and the source bus is electrically coupled to the source contact through the first isolation layer. A second isolation layer is formed over the second conductive layer and insulates the source bus from the drain bus. A plurality of conductive bumps are formed over the second isolation layer, at least one of the conductive bumps directly contacting the drain bus and at least one of the conductive bumps directly contacting the source bus through the second isolation layer.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

As used herein, the following dopant concentrations are distinguished using the following notations:
(a) N++ or P++: dopant concentration>$5 \times 10^{19}$ atoms/cm$^3$;
(b) N+ or P+: dopant concentration of $1 \times 10^{18}$ to $5 \times 10^{19}$ atoms/cm$^3$;
(c) N or P: dopant concentration of $5 \times 10^{16}$ to $1 \times 10^{18}$ atoms/cm$^3$;
(d) N− or P−: dopant concentration of $1 \times 10^{15}$ to $5 \times 10^{16}$ atoms/cm$^3$; and
(e) N−− or P−−: dopant concentration<$1 \times 10^{15}$ atoms/cm$^3$.

Figure 1:
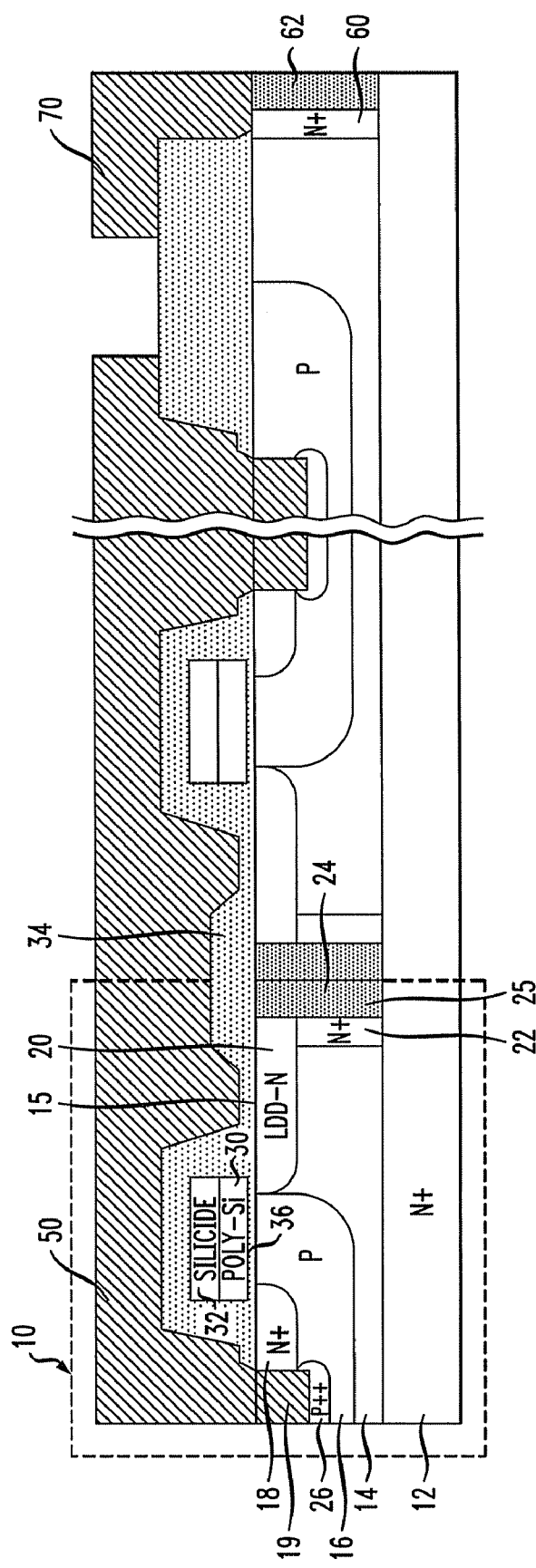
FIG. 1 is a partial cross-sectional view of a macro-cell device comprising a plurality of power LDMOS devices from an exemplary chip-scale device.

FIG. 1 is a partial cross-sectional view of a macro-cell device 100 (sometimes referred to herein as a "quasi-lateral LDMOS cell") comprising a plurality of parallel coupled elemental diffused MOS (LDMOS) transistors 10. Although only two such LDMOS transistors 10 are shown, it should be understood that hundreds of such devices are coupled in parallel to form a single functional macro-cell device 100. In one embodiment, each macro-cell device 100 includes between about 50-200, and preferably about 100, LDMOS transistors 10, each having a pitch of about 2 μm, for a total pitch of about 100-400 μm for the macro-cell device 100. As described more fully below, an exemplary chip-scale or near chip-scale power LDMOS device includes several macro-cell devices 100 coupled together through a bus structure to operate as a single power LDMOS device.

Although the present description focuses on various aspects of the bus structure of the exemplary semiconductor device, an overview of the details of the individual LDMOS transistors 10 is first provided. More specific details of the operation and various embodiments of the LDMOS transistors 10 shown in FIG. 1, as well as methods of manufacturing the same, can be found in commonly assigned U.S. patent application Ser. No. 11/180,155, entitled "Power LDMOS Transistor" filed Jul. 13, 2005, the entirety of which is hereby incorporated by reference herein.

As noted above, the macro-cell device 100 includes a plurality of LDMOS transistors 10, one of which is highlighted for purposes of description. The transistor structure 10 includes a semiconductor substrate 12, which, in the illustrated embodiment, is preferably a highly doped (N+) silicon wafer doped with arsenic or phosphorous, for example. Highly doped (N+) substrates have lower resistances than P+ substrates, although in alternative embodiments, the substrate 12 may be P+ doped.

A lightly doped silicon epitaxial layer 14 is formed over the substrate 12 and has an upper surface 15. In certain embodiments, the epitaxial layer 14 can have dopants of N (arsenic or phosphorous) or P (boron) dopant type and a dopant concentration of N-, N--, P- or P--. In one embodiment, the epitaxial layer has a thickness between about 1.5 to 3.5 μm.

The doping of the epitaxial layer is usually much lower than the doping concentration of the implanted source/drain regions. On the other hand, in case of devices with vertical current flow, the background doping of the epitaxial layer is preferably as high as possible in order to reduce the on resistance between the drain and source (Rds,on) while being just low enough to meet the targeted breakdown voltage of the transistor. With the device 10, however, the original doping of the epitaxial layer has no effect on the resistance of the device because current flows through the vertical drain contact region 22, and the doping concentration can be kept very low, such as below $5\times10^{16}$ atoms/cm$^3$, and more preferably at or below $2\times10^{16}$ atoms/cm$^3$, for example.

A conductive gate overlies the upper surface 15 of the epitaxial layer 14. In the embodiment illustrated in FIG. 1, the conductive gate comprises a lower doped polysilicon layer 30 with an upper silicide layer 32 formed therein or thereover by processes familiar to those in the art. Silicide layer 32 can comprise any transition metal silicide, and in exemplary embodiments is selected from the group consisting of Ti, W and Co. The conductive gate preferably has a thickness between about 0.3 to 0.6 μm and a length defined by the technology generation utilized in its fabrication, e.g., 0.8 μm, 0.5 μm, 0.35 μm. or 0.25, etc. The conductive gate is formed over a gate dielectric 36, which preferably comprises SiO$_2$ formed to a thickness between about 150 to 500 Å.

Dopant region 20 is formed completely within epitaxial layer 14 and forms an enhanced drain drift region. The enhanced drain drift region is formed abutting or at least proximate to the upper surface 15 of layer 14 and has a dopant concentration N in the illustrated embodiment. The enhanced drain drift region 20 increases the drain-to-source breakdown voltage of the LDMOS structure 10. Drain drift region 20 has a lateral dimension between about 0.5 to 1.5 μm, and a depth of between about 0.2 to 0.4 μm. The region 20 preferably extends below (i.e., is overlapped by) the conductive gate between about 0.05 to 0.15 μm and is known as lightly doped drain (LDD) structure in the literature, such as U.S. Pat. No. 5,907,173 to Kwon et al., the entirety of which is hereby incorporated by reference herein.

The LDMOS structure 10 also includes a source implant region 18 having a conductivity N+ spaced from the enhanced drain drift region 20. Source region 18 extends laterally between about 0.5 to 0.8 μm, has a depth between about 0.15 to 0.3 μm and also partially underlies the conductive gate between about 0.05 to 0.15 μm. A body region 16 having P-type dopants and having a conductivity of P concentration is formed in epitaxial layer 14 and has a subregion between the source 18 and enhanced drain region 20, forming a channel region therebetween. The body region 16 includes source contact region 18 and body contact region 26. In exemplary embodiments, the body region 16 is formed to a depth of between about 0.5 to 1.0 μm and horizontal length between about 0.8 to 1.5 μm.

The body contact region 26 has a dopant concentration P++ greater than the concentration of the body region 16. In one embodiment, the body contact region 26 is formed at the base of a shallow trench region 19 and has a lateral dimension between about 0.2 to 0.4 μm (half width of the shallow trench) and is formed to a depth between about 0.1 to 0.3 μm. The body contact region 26 provides for a low resistance contact between the source metal layer 50 (described in more detail below) and the body region 16. Under blocking condition where the voltage applied to the drain electrode results in a reverse bias of the body-to-drain PN-junction, the depletion layer or region is "squeezed" in the vertical direction between the contact implant 26 and the doping gradient from the substrate 12. The reduced width of the depletion layer results in a lower source-drain breakdown voltage, localizing the place where the breakdown occurs beneath the contact implant. This, in turn, defines the path for the current generated during the avalanche condition, i.e., when the electric field at the body-to-drain PN-junction is so high that it leads to a generation of minority carriers by impact ionization.

A deep trench region 25 (shown filled with a plug 24) is formed adjacent enhanced drain drift region 20 and spaced from the conductive gate. The trench 25 is formed between the upper surface 15 of the epitaxial layer 14 to the upper surface of the substrate 12. The trench enables the formation of vertical drain contact region 22 adjacent the sidewalls of trench region 25, which provides a low resistance path between the enhanced drain drift region 20 and substrate 12. In the n-channel embodiment shown in FIG. 1, the drain contact 22 has a dopant concentration N+ or higher and is formed by low angle implantation while trench 25 is open. Trench 25 is then filled with a conductive material (e.g., tungsten or doped polysilicon) or insulative material (e.g., $Si_xO_y$) to form plug 24. In one embodiment, drain contact 22 has a horizontal dimension into epitaxial layer 14 in the amount of about 0.4 to 0.8 μm. In other embodiments, the epitaxial layer is very thin (e.g., 1.0 μm) and there is no need to etch the trench. The drain contact is created by a diffused region(s) of first conductivity type, created by multiple implants and extending from the surface to the substrate. There is no need for a drain plug in this embodiment, as no deep trench 25 is formed.

The LDMOS device 10 also includes an insulating layer 34 formed over the source implant region 15, over the conductive gate sidewalls and its upper surface, as well as over the enhanced drain drift region 20 and contact plug 24. The insulating layer preferably comprises SiO$_2$ or SiO$_x$N$_y$. It should be understood, however, that insulating layer 34 can comprise several layers of insulating materials collectively forming insulating layer 34. Insulating layer 34 is preferably formed to a thickness of at least 0.03 μm on the sidewalls of the conductive gate and at least 0.05 μm on the top surface of the conductive gate. In an exemplary embodiment, insulating layer 34 is formed to a thickness between about 0.05-0.15 μm over the drain region 20. The insulating layer insulates the drain and gate regions from the source contact layer 50, described below.

As is shown in FIG. 1, device 10 also includes a source contact layer 50 (described in more detail below), which preferably comprises conductive material selected from the group consisting of Al, Ti/Al, Ti/TiN/Al or W blanket deposited over the device such as by CVD (chemical vapor deposition) or sputtering. The source contact layer 50 is deposited to fill shallow trench 19 to provide a contact to the source implant 18 as well as to provide a short between the source and body regions 18, 16. Source layer 50 extends over insulation layer 34, over the conductive gate and over the drain implant region 20 and drain plug 24. In one embodiment, the source metal layer 50 has a thickness defined between the upper surface 15 of the epitaxial layer 14 and its upper surface 29 between about 1.0 to 5.0 μm and preferably less than or equal to about 1.5 μm.

When the devices 10 are turned "on," the conduction current flows through the source metal 50, laterally through the channel underneath the gate to the drain contact region 20 and then vertically along the vertical, highly doped drain contact 22 to the substrate 12. The current from each device 10 then flows laterally through the substrate 12 to common vertical contact 60, which is preferably formed in the same manner as contacts 22, to the metal drain contact 70. As explained in connection with plug 24, plug 62 may be conductive or insulative.

In conventional vertical current flow power LDMOS devices having the drain electrode coupled to the bottom of the substrate, the substrate is preferably relatively thin, such as 200 μm thick, so as to provide a low resistance path that minimizes the contribution of the substrate to the on-resistance of the device. In embodiments, similar performance to these conventional devices, with respect to the contribution of the substrate to the on-resistance, is reached by restricting the pitch of the macro-cell device 100, and thus the pitch of the portion of substrate 12 assigned to an individual macro-cell device 100, to the thickness of the conventional devices, i.e., to about 200 μm. In other words, even though current flows primarily laterally through the substrate 12 rather than vertically, the substrate 12 contributes no more resistance to $R_{DS-ON}$ than with vertical devices. In one embodiment, if each individual device 10 has a pitch of about 2 μm, then each macro-cell device 100 includes about 100 transistor devices 10 coupled in parallel, each device 10 feeding drain current into the substrate 12 to flow laterally through the substrate 12, to the vertical contact 60 and then to the drain contact 70. The "pitch" of the macro-cell device is considered to be the distance from the edge of the source metal 50 (or center thereof if two macro-cell devices share the same source contact 50) to the edge of the drain metal 70 (or center thereof if two macro-cell devices share the same drain contact 70).

In exemplary embodiments, the substrate 12 has a thickness of at least 200 μm, and more preferably at least 300 μm. With thinner substrates, e.g., less than 200 μm in thickness, a metal layer may be formed on the bottom surface of the substrate to serve as the current carrier for the lateral current flow. Greater numbers of transistors 10 can be provided with increased substrate thicknesses.

As noted above, the macro-cell device 100 is sometimes referred to herein as quasi-lateral LDMOS cell because current flow is first vertical through the sinkers 22 and then laterally through the substrate 12.

With reference to FIG. 2, FIG. 2 is a partial, side sectional view showing in more detail the new connection structure for coupling the macro-cell devices 100 to a conductive solder bump. By "bump" it is meant a small sphere, half sphere, or other shaped protrusion that is bonded to a contact area or pad of a semiconductor device for electrical connection between a chip and substrate. While the bumps are shown as having rounded surfaces, it is understood that the solder bumps may be re-flowed in establishing bonds to, for example, a PCB substrate and, therefore, can change shape, such as to take on a more flat shape. Conductive layers are shown in cross-hatch in FIG. 2. The connection structure is shown formed over semiconductor die 200. In order not to obscure the details of the connection structure, the LDMOS devices 10 are not shown in or on semiconductor die 200, though it should be understood that die 200 includes a plurality of macro-cell devices 100 and LDMOS devices 10 formed therein, as detailed above in connection with FIG. 1.

The improved connection structure shown in FIG. 2 includes a first conductive layer 210, preferably a first metal layer, which makes electrical contact with the die 200. With cross-reference to FIG. 1, this first conductive layer provides the source metal layers 50 and drain metal layers 70 of the macro-cell devices 100 formed as shown in FIG. 1. Specifically, source contacts 212 of FIG. 2 correspond to source contact layers 50 of FIG. 1, and drain contact 214 of FIG. 2 corresponds to drain contact layer 70 of FIG. 1. FIG. 2 shows the intersection of two adjacent macro-cell devices 100a, 100b, at drain contact 214. Layer 210 can be formed by depositing a conductive layer and etching the layer to form the source and drain fingers 212, 214.

A first isolating or insulating layer 220 is formed over the first conductive layer 210. In exemplary embodiments, the first isolating layer 220 preferably comprises a layer or stack of layers comprising one or more of $SiO_2$, SiON and BPSG (boro-phospho-silicate glass) deposited in a low temperature plasma deposition process over and between the source and drain contacts 212, 214 to insulate the contacts from each other and subsequent layers formed thereover. Conductive vias 222 are formed through the isolating layer 220 to make electrical contact with the source contacts 212. Likewise, conductive vias 224 are formed through the isolating layer 220 to make electrical contact with drain contact 214. Although not shown, the source and drain contacts 212, 214 extend for the length of the transistor bodies, i.e., for substantially the length of the semiconductor die 200 (with FIG. 2 showing the width of a portion of the die 200). Therefore, several groups of vias 222 and 224, which are not shown, are provided along the length of the source contact and drain contact layers 212, 214. In an exemplary embodiment, isolating layer 220 is formed to a thickness of between 0.5-1.0 μm and source and drain contacts 212, 214 are separated a distance of between about 1-3 μm.

A second conductive layer 230 is formed over the first isolation layer to form a bus structure for collecting current from the macro-cell devices and carrying the current to conductive solder bumps. In a preferred embodiment, the second conductive layer 230, which is preferably a metal layer comprising Al or alloys thereof comprising copper and/or silicon, is thicker than the first conductive layer 210. In one exemplary embodiment, the second conductive layer has a thickness of between about 2 to 5 μm, whereas the first conductive layer has a thickness of less than or equal to about 1.5 μm. The first conductive layer 210 can be made relatively thin because it is not a collector of current, but rather provides contact to the transistors and thus serves as a conduit for the transistor current to the bus layer 230 at multiple points, i.e., at vias 222, 224.

As illustrated, the bus structure layer 230 includes two source busses 232 and a drain bus 234, which can be etched from a conductive layer deposited over isolation layer 220. Advantageously, this structure allows for allocation of about the same width to the source bus 232 as to the drain bus 234 so that each contributes equally to the on-resistance of the device. This feature is contrasted with the first conductive layer 210, which allocates significantly more width to the source contacts 212 than to the drain contacts 214. In exemplary embodiments, the drain and source busses 232, 234 each have a width between about 100-300 μm, and thus each bus pair has a pitch between about 200-600 μm, plus the separation distance therebetween.

Figure 2A:
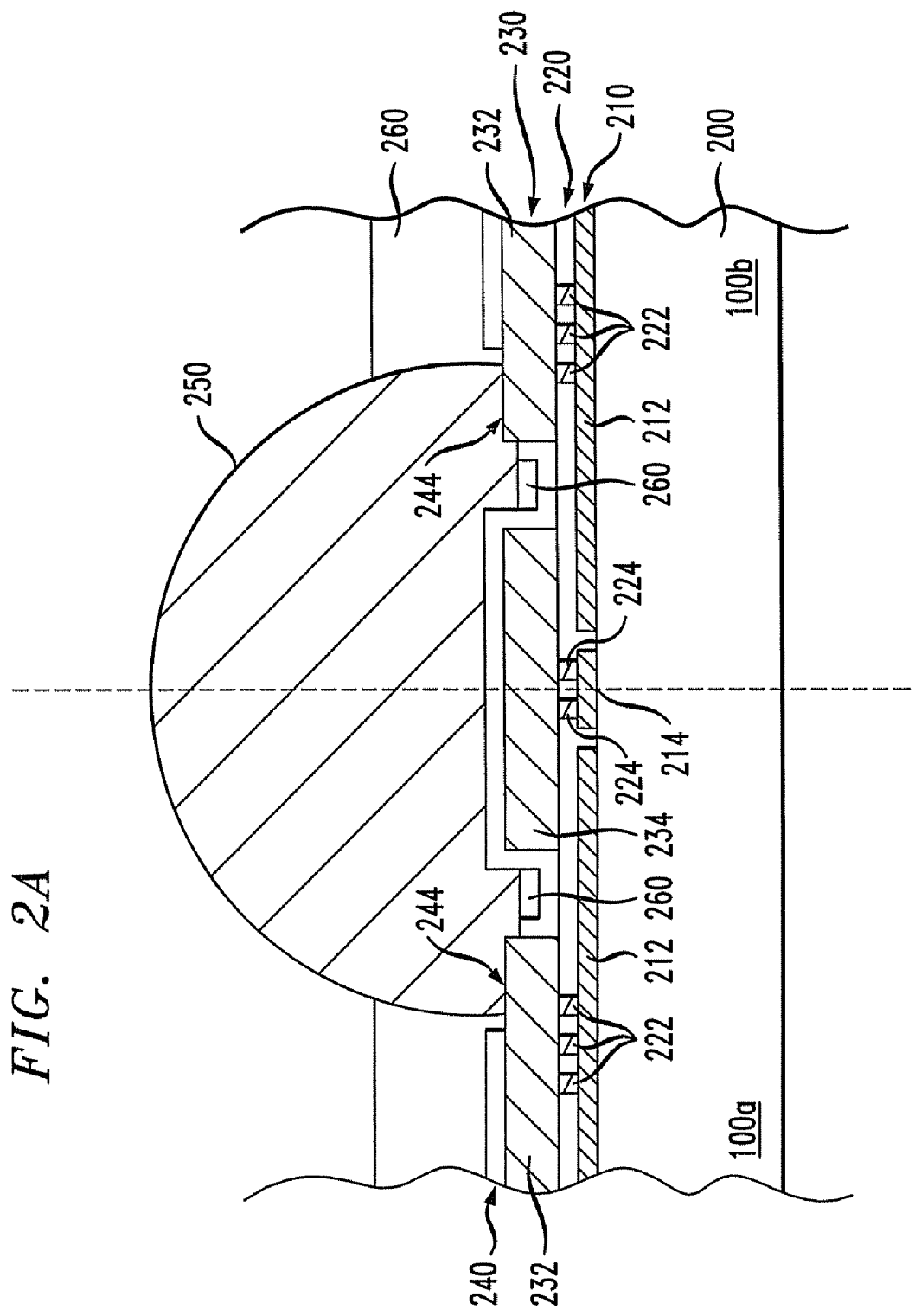
FIGS. 2-2B are partial cross-sectional views showing the connection of solder bumps to a die in an exemplary chip-scale device.

A second isolation layer 240 is formed over the second conductive layer 230. The second isolation layer 240, preferably comprising a layer or layers of material described above for first isolation layer 220, is conformably formed along the exposed surfaces of busses 232 and 234 and therebetween, insulating the busses 232, 234 from each other. As shown in FIG. 2, an opening 242 is formed, such as by an etch process, through the second isolation layer 240 to expose the drain bus 234, so that solder bump 250 can make electrical contact with the drain bus 234. FIG. 2A illustrates a solder bump 250 making contact to the source busses 232 through selectively formed openings 244.

In an exemplary embodiment, solder bump 250 has a diameter of about 300 μm. Solder bump 250 preferably comprise tin, as is conventional. One or more conductive layers, such as a seed layer and/or diffusion barrier layers, may also be formed between the busses 232, 234 and the solder bump 250.

FIG. 2 also illustrates that a third isolation layer 260 optionally may be formed over the second isolation layer 230. Isolation layers of this type, often comprising polyamide, provide a planarized surface, which is then etched to form openings for placement of bumps 250. Portions of this layer 260 may remain in the region between the busses 232, 234 as shown in FIG. 2. Processes for formation of layer 260 and solder bumps are familiar to those in the art and are not unnecessarily repeated herein.

From FIG. 2, it should be apparent that only one bus layer is needed. Further, the design does not require a layer of pads on which to form solder bumps, as the solder bumps are directly contacted to either the local source or drain bus, which is insulated from the other bus or busses by an isolation layer.

Figure 2B:
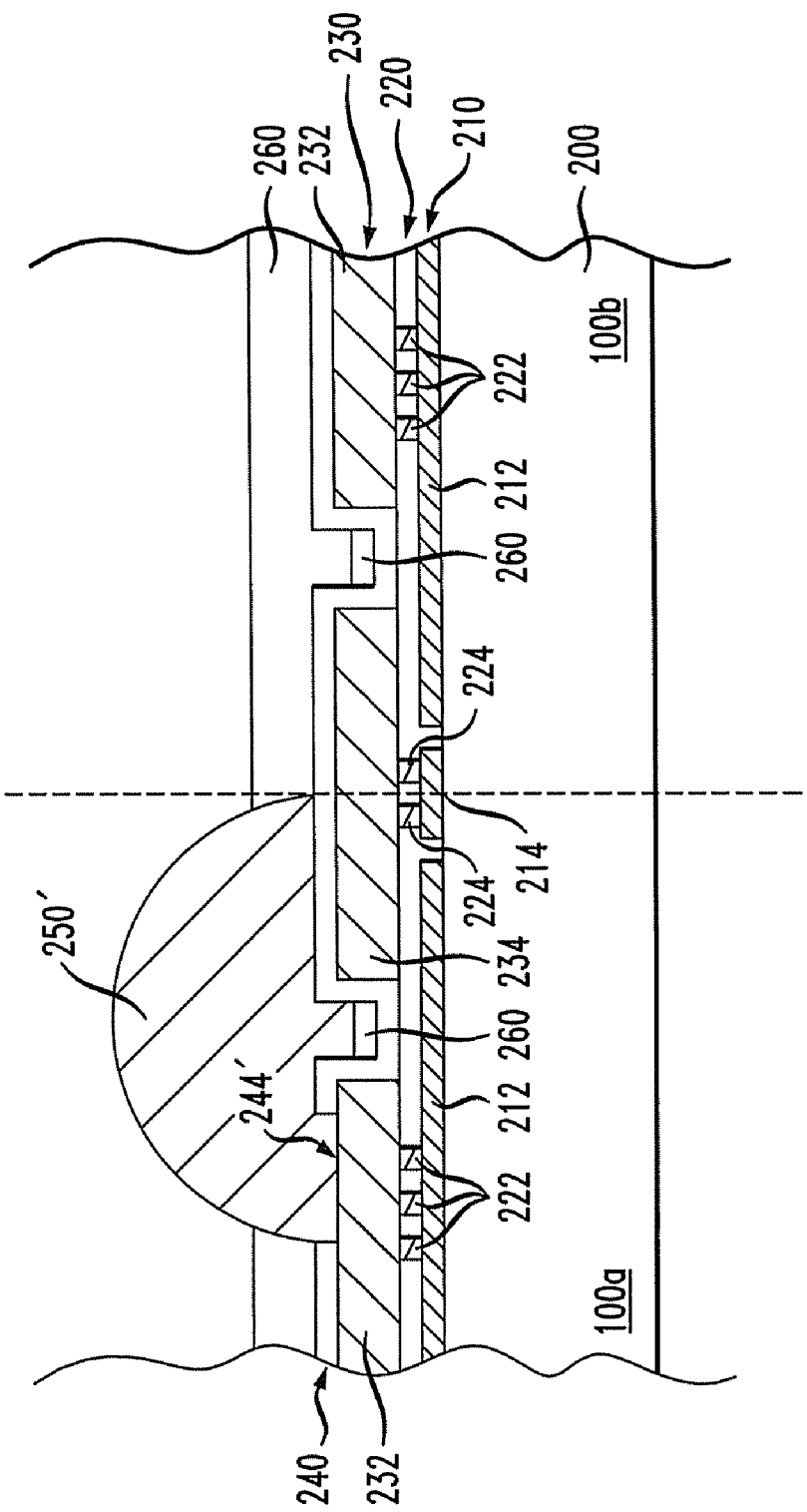

Although FIGS. 2 and 2A illustrate that the solder bump 250 overlaps three busses, in embodiments, the solder bump can overlap one bus or two buses equally, i.e., a pair of adjacent source and drain busses. An embodiment is shown in FIG. 2B, where conductive bump 250' overlaps two busses. An opening 244' is formed through second isolating layer 240 to make electrical contact between source bus 232 and solder bump 250'. A similar opening (not shown) would be formed through second isolating layer 240 to make contact between a solder bump and the drain bus 234.

In an exemplary device, the basic approach of FIGS. 2 to 2B can be repeated several times to form a matrix of spaced solder bumps over the semiconductor die. In one embodiment, a completed device includes a plurality of macro-cell devices 100 aligned across the width of the semiconductor die, but with solder bumps 250 formed in a grid/matrix pattern, as described in more detail below.

Figure 3:
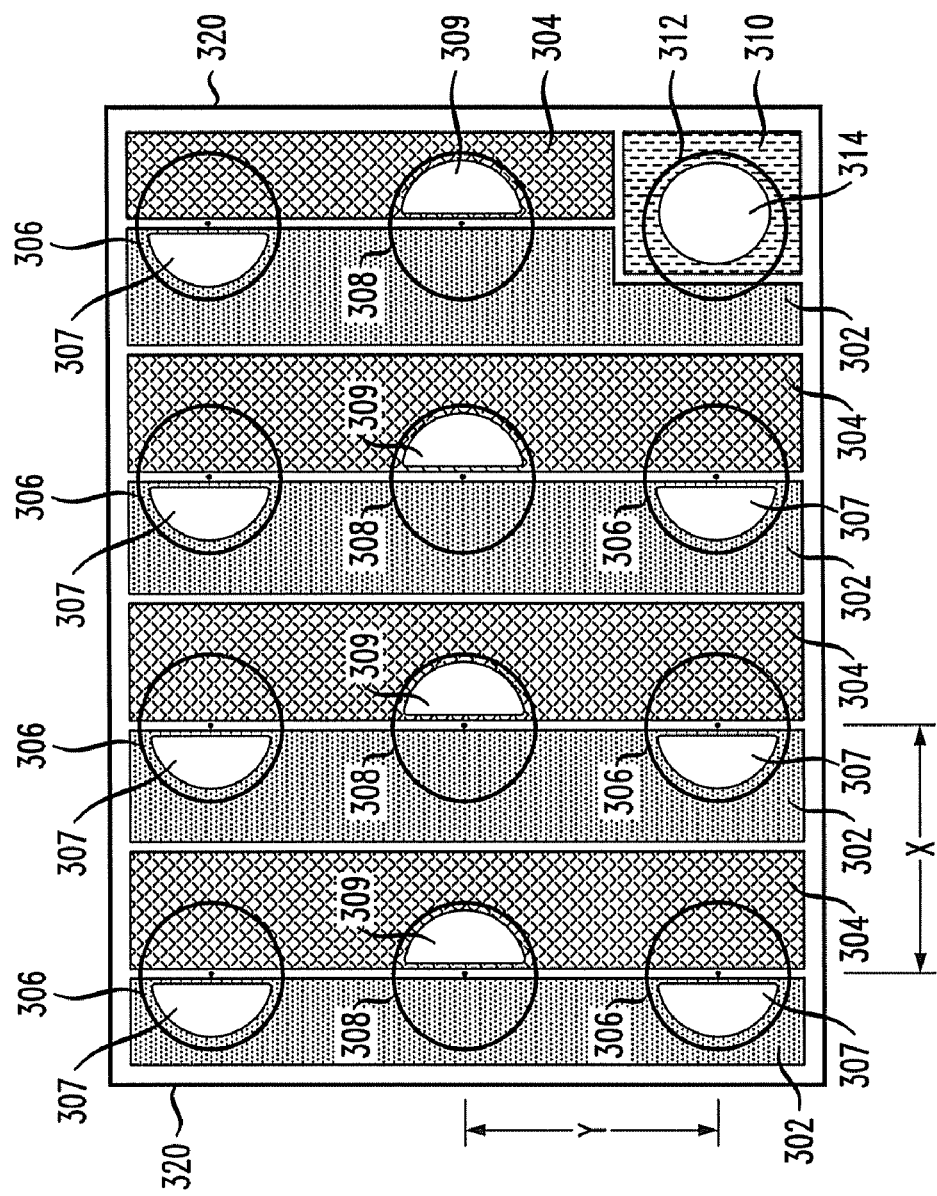
FIGS. 3-5 are top plan views illustrating solder bumps coupled to a bus structure in various embodiments of an exemplary chip-scale device.

FIG. 3 is a top plan view of an exemplary chip-scale device 300 having conductive solder bumps coupled thereto. FIG. 3 is essentially a top plan view of a device having a bump connection shown in FIG. 2B (i.e., with solder bumps centered on a source/drain bus pair) although with multiple macro-cell devices formed on the die and with multiple source and drain solder bumps formed thereover. For ease of illustration of the bus structure layer 230, second isolation layer 240 and third isolation layer 260 are not shown, although connection holes therethrough are illustrated.

The device 300 includes a plurality of parallel source and drain busses 302, 304, respectively, as described above in connection with FIGS. 2-2B. In one embodiment, each drain bus 302 and each source bus 304 is associated with two macro-cell devices, except for the busses positioned most proximate to the lateral edges 320 of the device. In one exemplary embodiment, each bus has a width between about 240-300 μm and adjacent busses are spaced about 10 μm.

In the illustrated embodiment, the device 300 includes a plurality of conductive solder bumps, with their diameters or footprints illustrated as circles, formed over the busses 302, 304. Twelve such conductive bumps are provided in the embodiment of FIG. 3. In this embodiment, each bump is preferably spaced a distance "X", "Y" of about 500 μm in both the X and Y directions, although is should be understood that the number of solder bumps, their positioning and spacing are determined in accordance with the preferred installation of the device on, for example, a printed circuit board. Solder bumps 306 are coupled to respective source busses 302 through openings 307 formed through the second isolation layer (not shown in FIG. 3) as explained above in connection with FIGS. 2-2B. Each drain solder bump 308 is coupled to a respective drain bus 304 through opening 309 formed through the second isolation layer.

The device also includes a gate bus 310 formed over a gate contact, not shown. As also illustrated in FIG. 3, a solder bump 312 is coupled to the gate bus 310 through an opening 314.

The illustrated connection scheme, where individual solder bumps can be selectively coupled to either a source or drain bus by selectively forming an opening over either a source or drain bus through an insulation layer, such as to provide the alternating source/drain connection pattern illustrated in FIG. 3., saves a great amount of space and eliminates the need for a third metal layer (e.g., a pad layer) on which to form the solder bumps connected to a desired bus. In the industry, the solder bump layout is generally predicated, and the bus structure is designed to accommodate the bump locations. Solder bumps are also advantageously equally spaced in both the north/south and east/west direction along the side of the semiconductor die. With the present design, most bumps can be directly coupled to either a source or a drain bus. The pitch of the bus pair, therefore, can be reduced, with consequent reduction in the size of each macrocell device, with still further consequent benefits in reductions in the on-resistance of the device.

Figure 4:
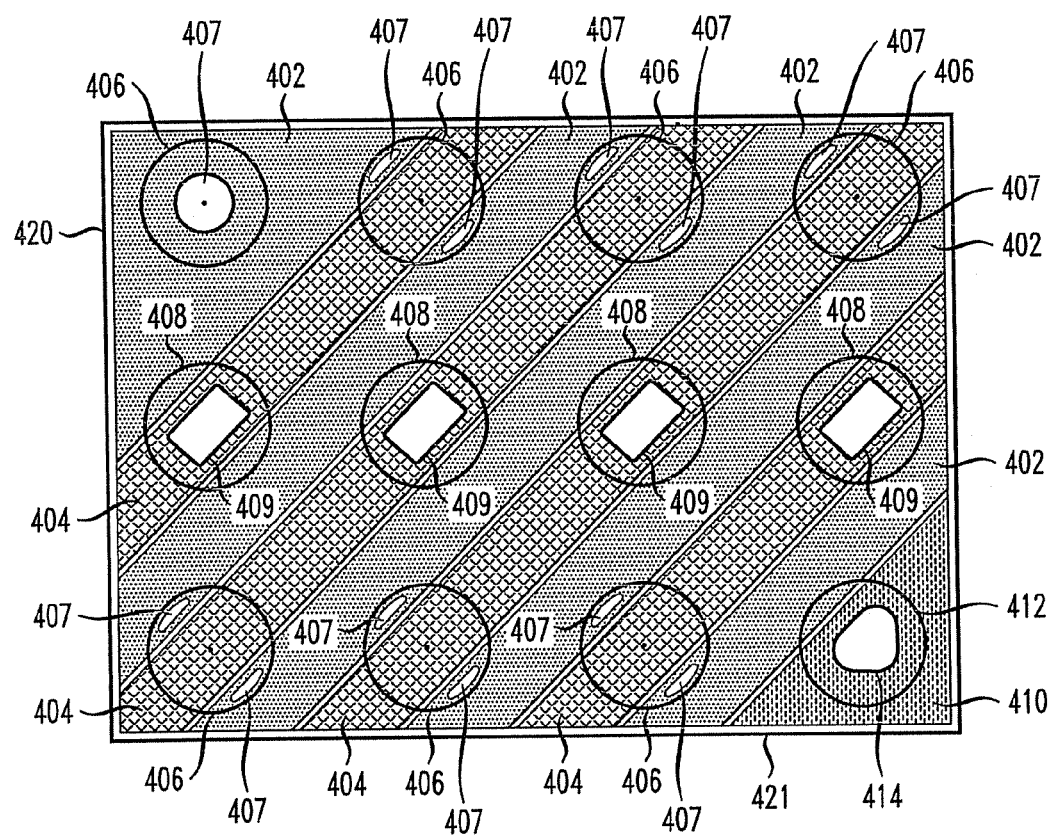

FIG. 4 illustrates an alternative embodiment of a chip-scale device 400 having a bus structure oriented at an oblique angle to the lateral sides 420 and bottom/top sides 421 of the device. In a preferred embodiment, the bus structure is angled at an angle of about 45°. The device 400 of FIG. 4 includes spaced source and drain busses 402, 404, respectively and spaced source and drain solder bumps 406, 408, respectively. The source bumps 406 make contact to source busses 402 through openings 407 formed through the second isolating layer (not shown), and the drain bumps 408 make contact to drain busses 404 through openings 409 formed through the second isolating layer. The gate solder bump 412 is coupled to the gate bus 410 through opening 414.

The underlying structure of the device 400 of FIG. 4 is essentially the same as shown in FIGS. 1-2B, although the transistor bodies are oriented at an angle to match the angle of the bus structure 402, 404. Assuming the same bump layout, spacing (about 500 μm) and size (about 300 μm in diameter) as those of FIG. 3, angling the bus structure allows for the use of more macro-cell devices in a given die area, although with each macro-cell device having fewer elemental LDMOS transistors 10. Assuming each adjacent source/drain or drain/source intersection represents a macro-cell device, the device 300 of FIG. 3 includes seven macro-cell devices (considering a singular cell at the edge of the die), whereas the device of FIG. 4 has eight macro-cell devices. Although the device 400 of FIG. 4 has more macro-cell devices than does the device 300 of FIG. 3, each macro-cell device in the device of FIG. 4 is provided with fewer elemental LDMOS devices such that the total number of transistors 10 in the device 400 is about equal to the total number of LDMOS devices 10 in the device 100 of FIG. 3. Providing each macro-cell device with fewer LMDOS transistors means that the current through the substrate of each macro-cell device flows a shorter distance, which in turn reduces the contribution of the substrate (through which the current flows) to the $R_{DS\text{-}ON}$ of the individual macro-cell devices, and, consequently, to the chip-scale device 400. In the embodiment of FIG. 4, each macro-cell device may include about 85 individual LDMOS devices 10, as opposed to the 110 individual LDMOS devices 10 of the embodiment of FIG. 3, assuming the pitch of the device in FIG. 3 is 500/2 μm minus 30 μm for the up-drain and assuming each unit cell is 2 μm. The individual busses are sized accordingly as explained below.

Figure 4A:
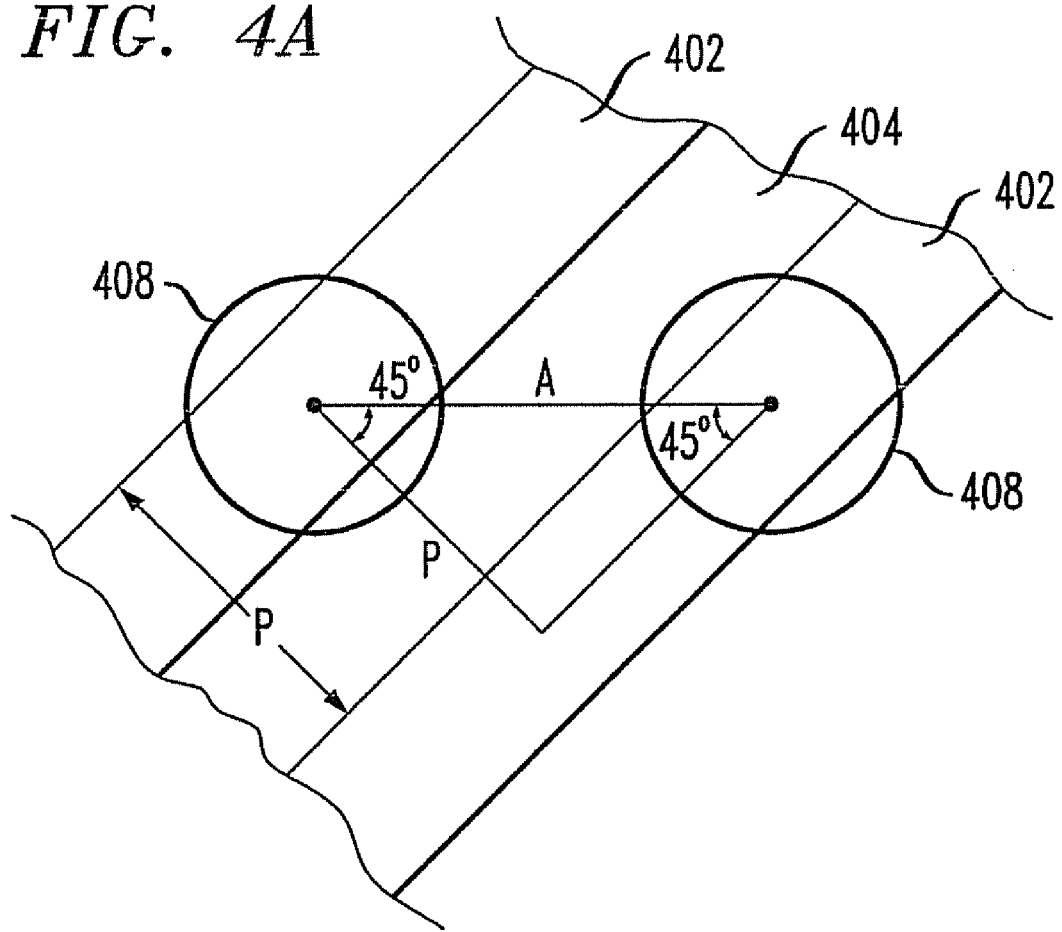

In the embodiment of FIG. 4, while the die size and bump structure are the same as those of FIG. 3, the pitch of the bus structure, and thus the silicon width assigned to each macro cell device, is smaller than the embodiment of FIG. 3. This is best seen from the partial illustration of FIG. 4A. Assuming the bumps 408 are spaced a distance A equal to their spacing in FIG. 3, e.g., about 500 μm, then a source/drain bus pair 402, 404 has a pitch equal to distance P, i.e., 500×sin (45°), or about 353 μm. Each bus, therefore, has a width of about 171 μm, assuming a 10 μm spacing therebetween.

Figure 5:
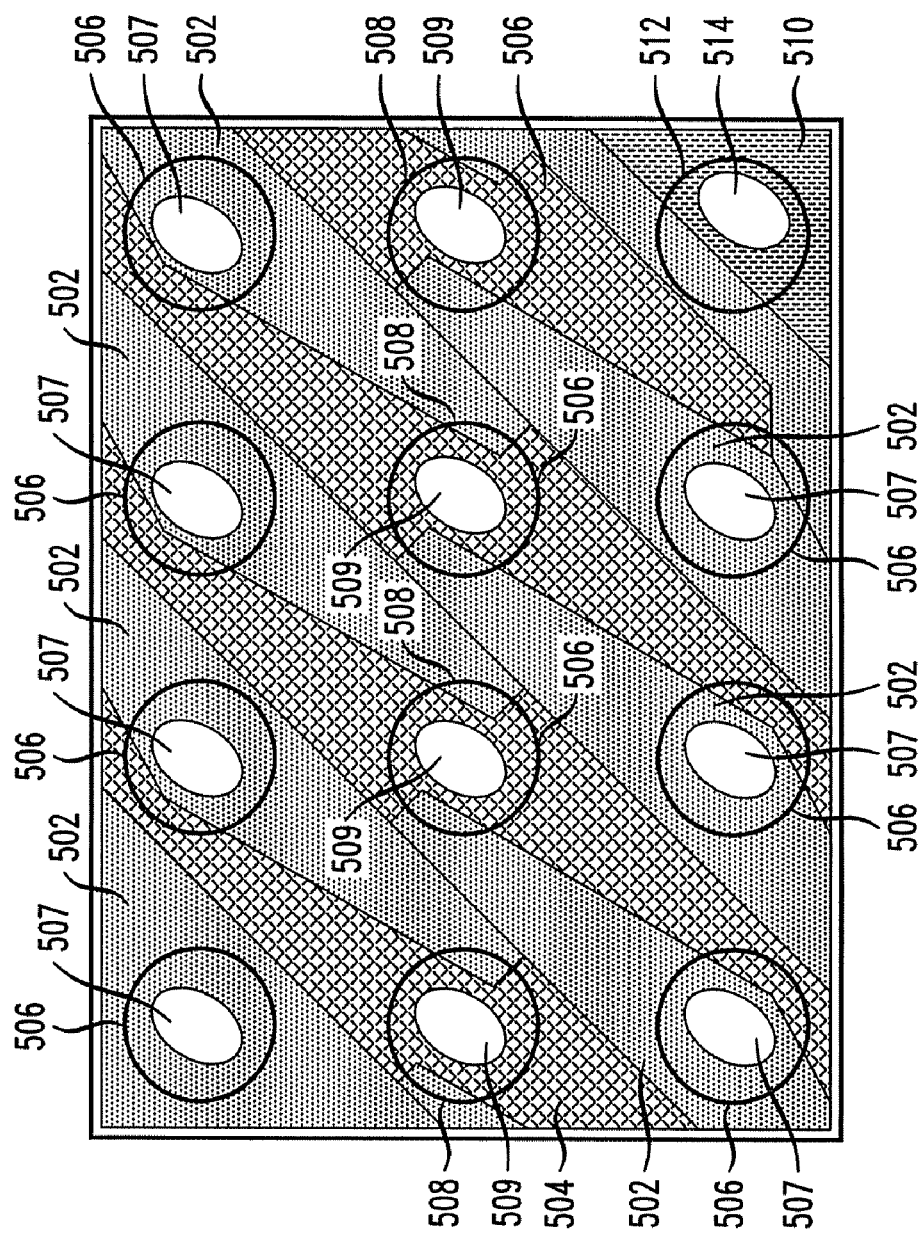

FIG. 5 illustrates another embodiment of a chip-scale device. The device 500 of FIG. 5 has an underlying structure (i.e., macro-cell device structure 100 and metal contact layer structure) that is identical to that of the device of FIG. 4, but the source and drain busses 502, 504 are irregularly shaped. Like the device 400 of FIG. 4. the device 500 includes conductive source bumps 506 coupled to source busses 502 through openings 507, conductive drain bumps 508 coupled to drain busses 506 through openings 509, and conductive gate bump 512 coupled to gate bus 510 through opening 514. In an exemplary embodiment, most source and drain busses 502, 504 are shaped to have a wider width proximate to their respective connection to a conductive bump 506 or 508, such as by using the generally trapezoidal shaped bus sections shown in FIG. 5. As can also be seen, adjacent source/drain pairs are oppositely oriented, so that their respective bus structures increase in width in opposite directions and offset one another to form a uniform shape (e.g, a rectangle).

Current flows vertically from the source and drain contacts through vias (described above) and into the bus structure. The current then flows along individual busses to conductive bumps. Larger currents flow in the busses proximate to the solder bumps, as current is collected at various locations along the length of individual buses for transport to the solder bumps. Therefore, by providing the source and drain busses 502, 504 with wider widths, and thus less resistance, proximate to the solder bump connections, the contribution of the bus structure to $R_{ds,on}$ of the device is reduced. Thus, instead of having a constant space allocation of ½ and ½ to the source and drain bus width, the width of each bus can, in one embodiment, vary between ¾ and ¼ of the width of a double macro-cell device.

Although FIG. 5 show the bus structure as being angled at an oblique angle with respect to the sides of the die, the busses of FIG. 5 need not be angled, but rather can be oriented in the direction illustrated in the embodiment of FIG. 3.

In exemplary applications, the chip scale device is used as a power device, and preferably a power device used at low power level, e.g., as a load switch in portable electronics equipment like cell phones or PDA's, although it is contemplated that the metallization and bus structure embodiments described herein could be used with larger devices and even for assembly of multi-chip modules (MCM). To that end, the disclosure herein is generally applicable to devices with die contacts in an up configuration and to devices other than LDMOS devices, such as MOS trench devices with drain or source sinkers for conducting current to contacts formed on the top surface of the semiconductor die, as well as BJT devices, diodes and the like.

The design described above allows for the formation of conductive bumps directly on a second metallization layer (i.e., the bus structure) without the need for a third metallization layer, thereby providing for lower $R_{ds,on}$ as there is one fewer layer to contribute to the on resistance, as well as reduced manufacturing costs and complexity. The placement of the solder bumps and connections to the bus structure are very flexible, as in embodiments, individual bumps are disposed to be selectively connectable to either a source or drain bus. Further, the bus structure shape can be changed to account for current densities proximate to the conductive bumps. Still further, the bus and underlying structure can be oriented to reduce the lateral pitch of the current flow through the substrate, again in an effort to minimize the contribution of individual elements, such as the substrate, of the device to the $R_{ds,on}$ of the device. Reduction in $R_{ds,on}$ address the debiasing effect concerns with product design.

Although the device of FIG. 1 is described in connection with an n-channel quasi-lateral LDMOS device in an up-drain configuration, it should be apparent that the disclosure herein is equally applicable to p-channel quasi-lateral LDMOS devices. Here, p-channel devices can be configured in an up-source configuration. Therefore, as used herein, the terms "source" and "drain" are understood to be interchangeable unless otherwise limited, and "up-drain" can mean "up-source" when used in connection with p-channel devices.

Figure 6:
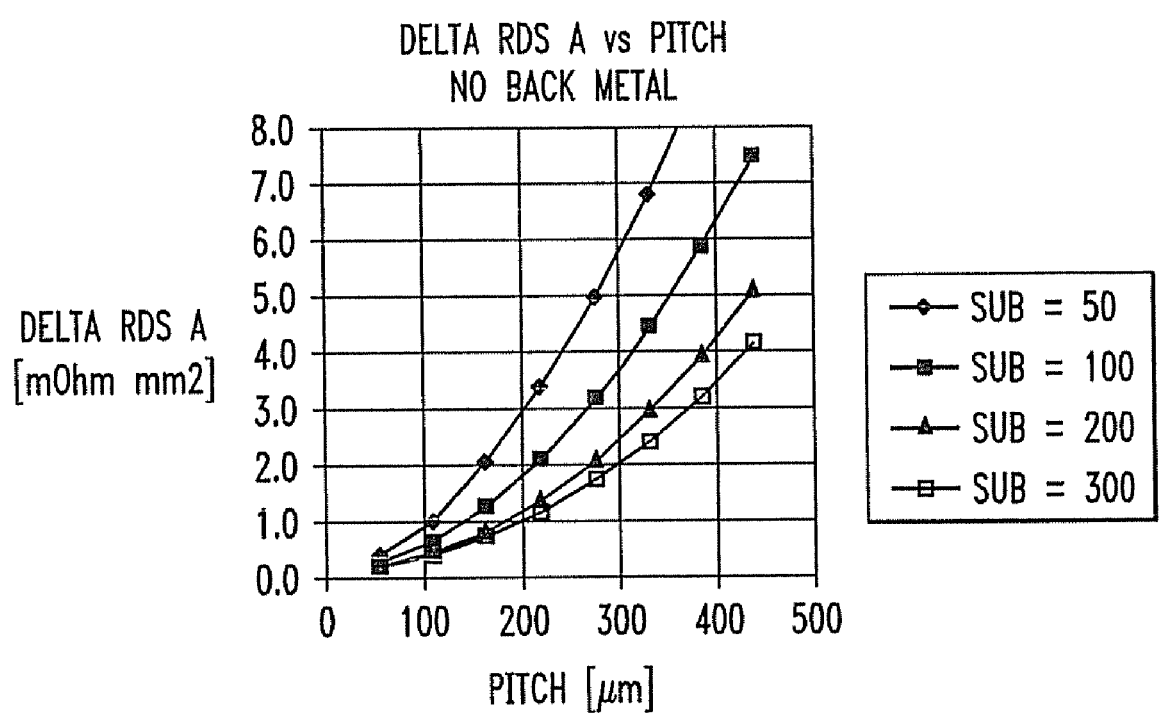
FIGS. 6 and 7 are graphs showing the contributions to $R_{DS-ON}$ by the substrate and bus structure of the exemplary chip-scale device.

FIG. 6 is a simulation graph of $R_{ds,on}$ for a macro-cell device 100 of FIG. 1 versus the pitch of the macro-cell device (i.e., the distance the current must flow laterally through the substrate) for substrates having thicknesses of 50, 100, 200 and 300 μm. The graph of FIG. 6 shows the change in the $R_{ds,on}$ as substrate thickness and pitch changes, but does not include the contribution toward $R_{ds,on}$ of the individual LDMOS devices (i.e., the contributions of the transistor channels and drain sinkers 22). Essentially, the graph isolates the contribution to $R_{ds,on}$ of the substrate. For purely vertical power devices of the prior art, one would expect an 8 mil substrate (about 200 μm) to contribute about 4 mΩ mm². From the graph, it can be seen that several combinations of device pitch and substrate thickness provide equivalent or better $R_{DS-ON}$ results than the 4 mΩ mm² expected from purely vertical devices.

Figure 7:
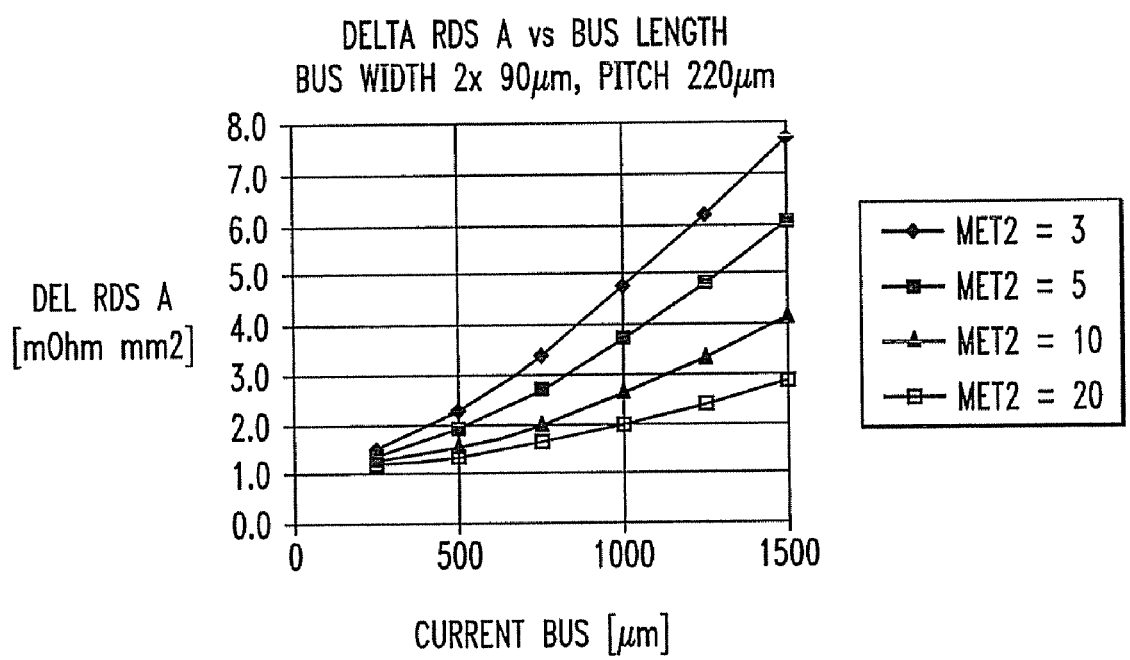

FIG. 7 is a simulation graph showing the additional contribution of the bus structure described above to $R_{ds,on}$. Specifically, FIG. 7 plots the $R_{ds,on}$ change verses changes in the bus length for different second metal thicknesses, i.e., 3, 5, 10 and 20 μm. For purposes of the simulation, it was assumed that the drain bus width is 2×90=180 μm, source bus width is 2×120=240 μm, and the spacing between the buses is 10 μm. These assumptions correspond to a single macro-cell pitch of 220 μm, and result in a total pitch of the bus structure of 440 μm covering 2 macro-cells.

The results presented in FIGS. 6 and 7 have been obtained with a circuit simulator PSPICE taking into account a parallel connection of 5 stripes each representing one cross-section through the chip-scale MOSFET with attributed lumped parameters.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A semiconductor device, comprising:
   a plurality of macro-cell devices, each of the macro-cell devices comprising a plurality of LDMOS devices formed over a semiconductor substrate and coupled together to form the macro-cell device, wherein current flows across the macro-cell device through the substrate to a common vertical contact;
   a first conductive layer formed over the substrate, the first conductive layer providing source and drain contacts for the macro-cell devices, one of the source and drain contacts electrically coupled to the common vertical contacts;
   a first isolation layer formed over the first conductive layer;
   a second conductive layer formed over the first isolation layer, the second conductive layer forming a plurality of spaced source and drain busses arranged as a plurality of adjacent source and drain bus pairs, each bus pair being electrically coupled to a respective macro-cell device, wherein the drain buses are electrically coupled to the drain contacts through the first isolation layer and the source buses are electrically coupled to the source contacts through the first isolation layer;
   a second isolation layer formed over the second conductive layer and insulating the source buses from the drain buses; and
   a plurality of conductive solder bumps formed over the second isolation layer, wherein each pair of busses has a plurality of conductive solder bumps formed thereover with each conductive solder bump overlapping both the source and drain busses of a respective pair of busses so as to allow connection by an individual conductive solder bump to either a source bus or a drain bus of the respective pair of busses through the second isolation layer, wherein the conductive solder bumps formed over the respective pair of busses are alternatingly contacted to the source and drain buses.

2. The semiconductor device of claim 1, wherein the second conductive layer is thicker than the first conductive layer.

3. The semiconductor device of claim 2, wherein the first conductive layer has a thickness of less than or equal to about 1.5 μm and the second conductive layer has a thickness of between about 2 to 5 μm.

4. The semiconductor device of claim 1, wherein each macro-cell device has a pitch between about 100-400 μm.

5. The semiconductor device of claim 1, wherein the busses are formed over a semiconductor die having generally orthogonal side edges, wherein at least some of the source and drain busses are generally rectangular in shape and are oriented at an oblique angle with respect to the side edges.

6. The semiconductor device of claim 5, wherein the angle is about 45°.

7. The semiconductor device of claim 1, wherein the source and drain busses have non-uniform widths along their respective lengths, the widths of each bus generally increasing toward a respective contacted conductive bump.

8. The semiconductor device of claim 7, wherein the source and drain busses are adjacent one another and arranged so that their widths increase in opposite directions.

9. The semiconductor device of claim 1, wherein the semiconductor device is an unpackaged, chip-scale device power MOS device.

10. A semiconductor device, comprising:
    a plurality of quasi-lateral LDMOS transistors in an up-source or drain configuration formed over a semiconductor substrate, wherein current flows across the quasi-lateral LDMOS transistors through the substrate to vertical contacts;
    a first conductive layer formed over the substrate, the first conductive layer providing respective source and drain contacts for the quasi-lateral LDMOS transistors, one of the source or drain contacts electrically coupled to the vertical contacts;
    a first isolation layer formed over the first conductive layer;
    a second conductive layer formed over the first isolation layer, the second conductive layer forming a plurality of adjacent source-drain bus pairs, each source drain bus pair comprising respective source and drain busses, wherein individual ones of the source-drain bus pairs are electrically coupled to respective source and drain contacts of a respective quasi-lateral LDMOS transistor through the first isolation layer;
    a second isolation layer formed over the second conductive layer and insulating the busses from one another; and
    a plurality of conductive solder bumps formed over the second isolation layer in a grid, the bumps alternatingly and directly contacted to source and drain busses through the second isolation layer, wherein at least some of the conductive solder bumps overlap both the source and drain busses of a respective source-drain bus pair so as to allow connection by an individual conductive solder bump through the second isolation layer to either a source bus or a drain bus of the respective source-drain bus pair.

11. The semiconductor device of claim 10, wherein the second conductive layer is thicker than the first conductive layer.

12. The semiconductor device of claim 11, wherein the first conductive layer has a thickness of less than or equal to about 1.5 μm and the second conductive layer has a thickness of between about 2 to 5 μm.

13. The semiconductor device of claim 10, wherein each quasi-lateral LDMOS transistor has a pitch between about 100-400 μm.

14. The semiconductor device of claim 10, wherein each pair of busses has a plurality of conductive solder bumps formed thereover with each conductive solder bump overlapping both the source and drain busses of the pair of busses.

15. The semiconductor device of claim 10, wherein the busses are formed over a semiconductor die having generally orthogonal side edges, wherein at least some of the source and drain busses are generally rectangular in shape and are oriented at an oblique angle with respect to the side edges.

16. The semiconductor device of claim 15, wherein the angle is about 45°.

17. The semiconductor device of claim 10, wherein at least some of the source and drain busses have non-uniform widths along their respective lengths, the widths of each bus generally increasing toward a respective contacted conductive bump.

18. The semiconductor device of claim 17, wherein the source and drain busses of at least some of the adjacent source-drain bus pairs are arranged so that their widths increase in opposite directions.

19. A semiconductor device, comprising:
   a plurality of quasi-lateral LDMOS transistors in an up-source or drain configuration formed over a semiconductor substrate;
   a first conductive layer formed over the substrate, the first conductive layer providing respective source and drain contacts for the quasi-lateral LDMOS transistors;
   a first isolation layer formed over the first conductive layer;
   a second conductive layer formed over the first isolation layer, the second conductive layer forming a plurality of adjacent source-drain bus pairs, each source drain bus pair comprising respective source and drain busses, wherein individual ones of the source-drain bus pairs are electrically coupled to respective source and drain contacts of a respective quasi-lateral LDMOS transistor through the first isolation layer, said second conductive layer having a thickness greater than the thickness of the first conductive layer;
   a second isolation layer formed over the second conductive layer and insulating the busses from one another; and
   a plurality of conductive solder bumps formed over the second isolation layer in a grid, the bumps directly contacted to source and drain busses through the second isolation layer, wherein each source-drain bus pair has a plurality of said conductive solder bumps formed thereover with each of said conductive solder bumps overlapping both source and drain busses of a given source-drain bus pair so as to allow direct connection by an individual conductive solder bump through the second isolation layer to either a source bus or a drain bus of the given source-drain bus pair.

* * * * *